United States Patent
Sugawara et al.

(10) Patent No.: US 7,323,047 B2
(45) Date of Patent: Jan. 29, 2008

(54) METHOD FOR MANUFACTURING GRANULAR SILICON CRYSTAL

(75) Inventors: Shin Sugawara, Higashiomi (JP); Eigo Takahashi, Higashiomi (JP); Nobuyuki Kitahara, Higashiomi (JP); Yoshio Miura, Higashiomi (JP); Hisao Arimune, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/387,624

(22) Filed: Mar. 22, 2006

(65) Prior Publication Data

US 2006/0213427 A1    Sep. 28, 2006

(30) Foreign Application Priority Data

Mar. 25, 2005 (JP) ............................. 2005-089390
Jun. 28, 2005 (JP) ............................. 2005-188639

(51) Int. Cl.
    *C30B 15/20* (2006.01)
(52) U.S. Cl. ............................. 117/18; 117/14; 117/214
(58) Field of Classification Search .................. 117/14, 117/18, 214
    See application file for complete search history.

(56) References Cited

U.S. PATENT DOCUMENTS 4,188,177 A    2/1980   Kilby et al.

FOREIGN PATENT DOCUMENTS

JP    2004-342827    * 11/2004
WO    WO99/22048    5/1999

* cited by examiner

*Primary Examiner*—Felisa Hiteshew
(74) *Attorney, Agent, or Firm*—Hogan & Hartson LLP (57) ABSTRACT

In a method for manufacturing a granular silicon crystal by allowing silicon melt in a crucible to be granularly discharged and fallen from a nozzle part composed of silicon carbide or silicon nitride, and cooling and solidifying the granular silicon melt during falling, a carbon source is added when the nozzle part is composed of silicon carbide, and a nitrogen source is added when the nozzle part is composed of silicon nitride, to the silicon melt in the crucible. Thereby, melt droplets of uniform size can be generated, so that granular silicon crystals having narrow variations in particle size can be manufactured at high productivity and superior reproducibility.

19 Claims, 2 Drawing Sheets

METHOD FOR MANUFACTURING GRANULAR SILICON CRYSTAL

Priority is claimed to Japanese Patent Application No. 2005-089390 filed on Mar. 25, 2005, and Japanese Patent Application No. 2005-188639 filed on Jun. 28, 2005, the disclosure of which is incorporated by reference in its entirety.

BACKGROUND OF THE INVENTION

1. Field of the Invention

The present invention relates to a method for manufacturing a granular silicon crystal and, in particular, a method for manufacturing a granular silicon crystal suitable for obtaining a granular silicon crystal for use in a photoelectric conversion apparatus.

2. Description of Related Art

A solar battery using a crystal silicon wafer and having high photoelectric conversion efficiency (hereinafter referred to as "conversion efficiency" in some cases) has come into use. This crystal silicon wafer is attained by cutting down a large single crystal or polycrystalline silicon ingot that has excellent crystallinity and less impurities, and has no offset in its distribution. However, a large single crystal or a polycrystalline silicon ingot takes long to manufacture, so that its productivity is poor and hence a wafer to be cut down from such an ingot is expensive. For this reason, there is a strong desire for a next generation solar battery that requires neither a large single crystal nor a polycrystalline silicon ingot and that is low cost in terms of photoelectric conversion efficiency.

A photoelectric conversion apparatus using a granular silicon crystal as a component of photoelectric conversion means is occupying the attention as a promising photoelectric conversion apparatus in the future commercial scene.

As a raw material for manufacturing a granular silicon crystal, there are presently used silicon minute particles resulting from grinding of a single crystal silicon material, and high-purity silicon subjected to vapor-phase synthesis by fluid bed method. The following methods are used to manufacture a granular silicon crystal. That is, the above raw material is classified by size or weight, and then melted in a container by infrared irradiation or high frequency induction heating. This melt is then solidified while allowing it to freely fall as droplets (granular melt) (see for example the pamphlet of International Publication No. WO99/22048). Alternatively, this melt is made in a spherical shape by high-frequency plasma heat melting (see for example the specification of U.S. Pat. No. 4,188,177).

However, the above conventional methods for manufacturing a granular silicon crystal suffer from the problem of poor productivity because it is difficult to homogenize the weight of minute particles of silicon as raw material. Since variations in the minute particles of silicon as raw material is reflected to the size of a granular silicon crystal to be manufactured therefrom, a raw material consisting of minute particles of uniform weight is required. For silicon, it is however difficult to obtain efficiently minute particles as raw material so as to have a particle size of 100 μm to 1000 μm and a small dispersion of particle size by means of grinding and classification.

Further, when obtaining minute particles of silicon by grinding, there may arise contamination from a ground media and hence contamination of impurities is unavoidable.

Additionally, a high frequency plasma heat melting apparatus for obtaining a granular silicon crystal calls for an extremely large power source or the like, and the apparatus cost is high and working power is large, resulting in high production cost.

In the method for manufacturing a granular silicon crystal in which silicon melt is solidified while allowing it to freely fall as droplets (granular melt), silicon melt is discharged and fallen from a nozzle part of a crucible containing the silicon melt. At this time, silicon in the silicon melt is reacted with carbon or nitrogen that is the material of the nozzle part composed of silicon carbide or silicon nitride, which can cause enlargement of a nozzle hole of the nozzle part. In this case, the sizes of droplets of the silicon melt vary in a short period (i.e., if used one or two times), failing to yield granular silicon crystals of uniform particle size at high productivity. Moreover, the nozzle hole of the nozzle part deforms and incapacitates in a short period, and it becomes necessary to replace the nozzle part frequently, which is obstacle to reducing production cost.

Thus, the conventional methods for manufacturing a granular silicon crystal have the problems of low productivity of a granular silicon crystal, wide variations in the particle diameter of manufactured granular silicon crystals, and high manufacturing cost.

SUMMARY OF THE INVENTION

The present invention provides a method for manufacturing a granular silicon crystal that enables a granular silicon crystal of high purity to be manufactured at high productivity and low cost.

A method for manufacturing a granular silicon crystal of the present invention includes: allowing silicon melt in a crucible to be granularly discharged and fallen from a nozzle part composed of silicon carbide or silicon nitride; and cooling and solidifying the granular silicon melt during falling. To the silicon melt in the crucible, a carbon source is added when the nozzle part is composed of silicon carbonate, and a nitrogen source is added when the nozzle part is composed of silicon nitride.

Preferably, the carbon source is carbon-containing gas, and the nitrogen source is nitrogen-containing gas. To atmospheric gas in the crucible containing silicon melt, carbon-containing gas is added when the nozzle part is composed of silicon carbide, and nitrogen-containing gas is added when the nozzle part is composed of silicon nitride.

Thereby, a trace amount of carbon or nitrogen in the atmospheric gas enters into the silicon melt, so that the reaction between the material of the nozzle part and the silicon melt can be suppressed to inhibit deformation of the nozzle part. As a result, melt droplets of uniform size can be generated, and granular silicon crystals having narrow variations in particle size can be manufactured at high productivity and superior reproducibility.

In other method for manufacturing a granular silicon crystal of the present invention, the carbon source is a carbon-containing inorganic solid member, and the nitrogen source is a nitrogen-containing inorganic solid member. Into the silicon melt in the crucible, the carbon-containing inorganic solid member is added when the nozzle part is composed of silicon carbide, and the nitrogen-containing inorganic solid member is added when the nozzle part is composed of silicon nitride.

Preferably, the carbon-containing inorganic solid member is composed of graphite or silicon carbide, and the nitrogen-containing inorganic solid member is composed of silicon nitride. In addition, the carbon-containing or nitrogen-containing inorganic solid member is disposed so as to cover above the nozzle hole of the nozzle part, and there is formed a large number of through holes that block passage of silicon carbide particles or silicon nitride particles generated in the silicon melt.

This enables the carbon and nitrogen of the inorganic solid member to be introduced in a trace amount and to a saturated concentration extent into the silicon melt. Consequently, the silicon in the silicon melt is hardly reacted with the nozzle part, and reacted with carbon or nitrogen derived from the inorganic solid member. A reactant will exist in the form of silicon carbide or silicon nitride in the silicon melt, thereby considerably suppressing the silicon in the silicon melt from reacting with carbon or silicon that is the material of the nozzle part. Moreover, the presence of the large number of through holes in the inorganic solid member can prevent the bulk of silicon carbide particles or silicon nitride particles present in the silicon melt from reaching the nozzle part side. This suppresses clogging of the nozzle hole of the nozzle part, through which the silicon melt is discharged, permitting further stable production. As a result, the deformation of the nozzle part can be suppressed, so that melt droplets of uniform size can be generated for a long time and hence granular silicon crystals having narrow variations in particle size can be manufactured at high productivity and superior reproducibility.

DESCRIPTION OF PREFERRED EMBODIMENTS

Preferred embodiments of a method for manufacturing a granular silicon crystal according to the present invention will be described below with reference to the accompanying drawings.

Figure 1:
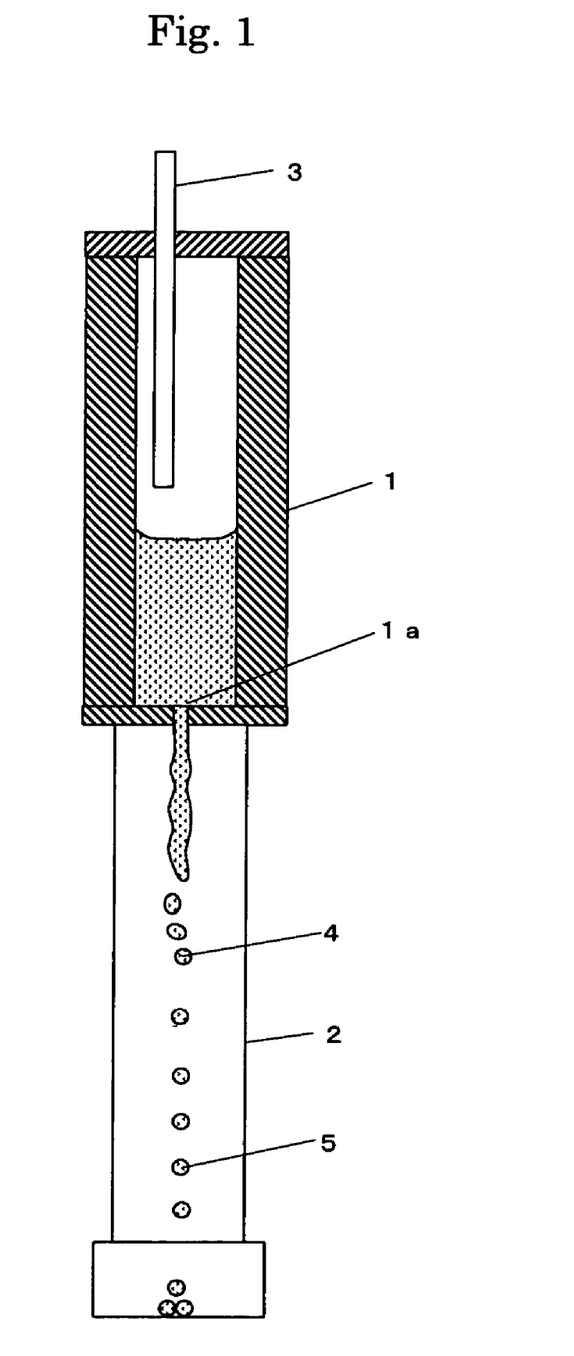
FIG. 1 is a sectional view of a basic construction of a manufacturing apparatus for use in a method for manufacturing a granular silicon crystal according to one preferred embodiment of the present invention.

FIG. 1 is a sectional view showing a schematic construction of a manufacturing apparatus in one preferred embodiment of a method for manufacturing a granular silicon crystal according to the present invention. Referring first to FIG. 1, the reference character 1 designates a crucible; the reference character 1a designates a nozzle part disposed on the bottom of the crucible 1; the reference character 2 designates a pipe arranged beneath the crucible 1 such that its longitudinal direction is the vertical direction; the reference character 3 designates a gas introducing pipe disposed at the crucible 1 and composed of quartz; the reference character 4 designates granular silicon melt; and the reference character 5 designates a granular silicon crystal.

<Crucible>

The crucible 1 is a container for obtaining silicon melt by heating and melting silicon particles as raw material, and for discharging the silicon melt as the granular silicon melt 4 from the nozzle part 1a on the bottom thereof. The silicon melt so obtained in the crucible 1 is discharged through the nozzle part 1a into the pipe 2, and then falls as the granular silicon melt 4 on the inside of the pipe 2. The crucible 1 is made up of a material having a higher melting point than silicon. Preferably, the crucible 1 is made up of a material exhibiting low reactivity with silicon melt. Higher reactivity with silicon melt is unsuitable because a large amount of the material of the crucible 1 enters into the granular silicon crystal 5.

Preferably, the material of the crucible 1 is carbon, silicon carbide sintered body, silicon carbide crystalline, boron nitride sintered body, silicon oxynitride sintered body, quartz, crystal, silicon nitride sintered body, aluminum oxide sintered body, sapphire, and magnesium oxide sintered body. It may also be a complex, mixture, or combination of these materials. In an alternative, a silicon carbide film, silicon nitride film, or silicon oxide film may be coated on the surface of a substrate composed of the above material. As a method for heating the raw material to not less than a melting point in the crucible 1, electromagnetic induction heating or resistance heating is suitable.

<Carbon Source>

The nozzle part 1a is composed of silicon carbide (silicon carbide crystalline or silicon carbide sintered body) or silicon nitride (silicon nitride sintered body). Preferably, a nozzle hole to be formed in the nozzle part 1a is in a cylindrical shape having a diameter of 80 µm to 200 µm and a length of 0.5 mm to 2 mm. No particular limitation is imposed upon the shape of the nozzle hole, except that its exhaust port has substantially a circular lateral cross section. For example, the nozzle hole may be of substantially conical.

When the material of the nozzle part 1a is silicon carbide (silicon carbide crystalline or silicon carbide sintered body), carbon-containing gas is introduced and added into the atmospheric gas in the crucible 1. If no carbon is added to the atmospheric gas, there is no chance that a trace amount of carbon may enter into the silicon melt from the atmospheric gas. This enhances reaction between the silicon melt containing no carbon and the nozzle part 1a, so that the nozzle part 1a undergoes a change in shape. As a result, for example, the nozzle hole of the nozzle part 1a is enlarged, and the granular silicon melt 4 is enlarged with time, making it difficult to obtain a granular silicon crystal 5 of required particle diameter. For a larger nozzle hole, the granular silicon melt 4, before its solidification, reaches the bottom of the pipe 2, failing to obtain as the granular silicon crystal 5.

Preferably, the carbon-containing gas as a carbon source is carbon dioxide gas, carbon monoxide gas, methane gas, acetylene gas, methylene gas, methanol gas, or ethanol gas. In particular, carbon monoxide gas or carbon dioxide gas is preferred because it is easily dissolved in the silicon melt of high reducibility.

Carbon-containing gas is introduced and added into argon gas as an atmospheric gas supplied into the crucible 1. That is, carbon-containing gas is added to the atmospheric gas in the crucible 1 through the gas introducing pipe 3 such that a trace amount of carbon-containing gas is introduced from the atmospheric gas into the silicon melt, allowing the trace amount of carbon to be introduced into the silicon melt without allowing carbon to enter as impurities in such an amount as to considerably deteriorate the crystal quality of the granular silicon crystal 5. This can suppress enlargement of the nozzle hole, achieving the granular silicon crystal 5 of high purity and high quality.

When a trace amount of carbon is introduced from the atmospheric gas to the silicon melt, it is preferred to add carbon in an amount of $1 \times 10^{17}$ atoms/cm$^3$ to $1 \times 10^{19}$ atoms/

$cm^3$ per silicon of 1 $cm^3$. Below $1\times10^{17}$ atoms/$cm^3$, the silicon carbide of the nozzle hole is eluted into the silicon melt thereby to facilitate enlargement of the diameter of the nozzle hole. Above $1\times10^{19}$ atoms/$cm^3$, silicon carbide particles deposit and condense in the silicon melt thereby to facilitate clogging of the nozzle hole. To add carbon in the above-mentioned range to the silicon melt, the amount of carbon in the melt is adjusted by controlling the amount of carbon-containing gas to be added to argon gas.

It is preferred that in the gas introducing pipe 3 for adding carbon to the silicon melt, the lower end thereof as a gas exhaust port be positioned 10 mm to 300 mm above from the silicon melt surface. Below 10 mm, rocking of the silicon melt surface may bring the gas introducing pipe 3 into a direct contact with the silicon melt, causing elution of the material of the pipe 3. Above 300 mm, gas for adding carbon fails to reach the silicon melt surface, resulting in insufficient addition of carbon.

<Nitrogen Source>

When the nozzle part 1a is composed of silicon nitride sintered body, a trace amount of nitrogen is introduced into the silicon melt by adding nitrogen-containing gas to the atmospheric gas in the crucible 1. If no trace amount of nitrogen is introduced into the silicon melt, there may arise large reaction between silicon and the nozzle part 1a, so that the nozzle part 1a undergoes a change in shape. As a result, the nozzle hole of the nozzle part 1a is enlarged, and the granular silicon melt 4 is enlarged with time, making it difficult to obtain a granular silicon crystal 5 of required particle diameter. For a larger nozzle hole, the granular silicon melt 4, before its solidification, reaches the bottom of the pipe 2, failing to obtain as the granular silicon crystal 5.

Preferably, the nitrogen-containing gas as a nitrogen source to the silicon melt is nitrogen gas, nitrogen oxide gas, or ammonia gas. In particular, nitrogen gas is preferred because it can suppress an increase in the oxygen concentration of the silicon melt.

Nitrogen-containing gas is introduced and added into argon gas as atmospheric gas supplied into the crucible 1. That is, nitrogen-containing gas is added to the atmospheric gas in the crucible 1 through the gas introducing pipe 3 such that a trace amount of nitrogen-containing gas in the atmospheric gas is introduced into the silicon melt, allowing the trace amount of nitrogen in the atmospheric gas to be introduced into the silicon melt. This can suppress enlargement of the nozzle hole of the nozzle part 1a. As a result, without allowing nitrogen to enter as impurities in such an amount as to considerably deteriorate the crystal quality of the granular silicon crystal 5, the trace amount of nitrogen can be introduced into the silicon melt, achieving the granular silicon crystal 5 of high purity and high quality.

When a trace amount of nitrogen is introduced from the atmospheric gas to the silicon melt, it is preferred to add nitrogen in an amount of $2\times10^{17}$ atoms/$cm^3$ to $2\times10^{19}$ atoms/$cm^3$ per silicon of 1 $cm^3$. Below $2\times10^{17}$ atoms/$cm^3$, the silicon nitride of the nozzle hole is eluted into the silicon melt thereby to facilitate enlargement of the diameter of the nozzle hole. Above $2\times10^{19}$ atoms/$cm^3$, silicon nitride particles deposit on a portion on the silicon melt side of the nozzle part 1a thereby to facilitate clogging of the nozzle hole. To add nitrogen in the above-mentioned range to the silicon melt, the amount of nitrogen in the melt is adjusted by controlling the amount of nitrogen-containing gas to be added to argon gas.

It is preferred that in the gas introducing pipe 3 for adding nitrogen to the silicon melt, the lower end thereof as a gas exhaust port be positioned 10 mm to 300 mm above from the silicon melt surface. Below 10 mm, rocking of the silicon melt surface may bring the lower end of the gas introducing pipe 3 into a direct contact with the silicon melt, causing elution of the material of the gas introducing pipe 3. Above 300 mm, gas for adding nitrogen fails to reach the silicon melt surface, so that insufficient addition of nitrogen is apt to occur.

In the present invention, it is preferred that after carbon-containing gas is added when the nozzle part 1a is composed of silicon carbide, or after nitrogen-containing gas is added when the nozzle part 1a is composed of silicon nitride, to the atmospheric gas in the crucible 1 containing silicon melt, the pressure of the atmospheric gas in the crucible 1 is raised than the pressure before adding the above gas. This enables the carbon or nitrogen in the atmospheric gas to efficiently enter into the silicon melt. Preferably, the pressure of the atmospheric gas in the crucible 1 is about 0.01 to 0.1 MPa higher than the pressure in the pipe 2 made of quartz. Below 0.01 MPa, it is difficult to efficiently introduce the carbon or nitrogen within the atmospheric gas into the silicon melt. Above 0.1 MPa, carbon or nitrogen may be introduced into the silicon melt as impurities in such an amount as to deteriorate the crystal quality.

The pressure of the above atmospheric gas can be changed by one that is provided with a hydraulic or electric piston and a cylinder, or by a compression pump or the like.

<Pipe>

In the present invention, the pipe 2, disposed such that its longitudinal direction is the vertical direction so as to extend downward from the nozzle part 1a of the crucible 1, is a container for cooling and solidifying during the falling of the granular silicon melt 4 discharged from the nozzle part 1a. The interior of the pipe 2 is controlled to a desired pressure with desired atmospheric gas. Preferably, the desired atmospheric gas is helium gas or argon gas, because it is inert gas and capable of preventing impurities in the atmospheric gas from entering into the granular silicon melt 4. In addition, helium gas or argon gas exhibits low reactivity with the granular silicon melt 4 thereby to suppress a reaction layer inhibiting solidification and crystallization of the granular silicon melt 4 from being formed on the surface of the granular silicon melt 4. The pressure of helium gas or argon gas can be controlled by adjusting its inflow and outflow.

Preferably, the pipe 2 is made up of a material having a higher melting point than silicon, or has a cooling structure (not shown) for cooling the pipe 2 itself.

When the material of the pipe 2 has a higher melting point than silicon, if the granular silicon melt 4 is discharged obliquely and collides with the inner wall of the pipe 2, there is no chance that the pipe 2 is heated to not less than the melting point of the material thereof and that the material of the pipe 2 enters as impurities into the granular silicon melt 4 so collided.

On the other hand, when the melting point of the material of pipe is lower than the melting point of silicon, if the granular silicon melt 4 is discharged obliquely and collides with the inner wall of the pipe 2, the pipe 2 is heated to not less than the melting point of the material thereof and, in some cases the material of the pipe 2 enters as impurities into the granular silicon melt 4 so collided. This is unfavorable, however, it is possible to add a cooling structure for cooling the pipe 2 itself, in order to prevent the material of the pipe 2 from being heated to not less than the melting point of the material thereof due to the collision of the granular silicon melt 4. It is therefore possible to prevent impurities from entering into the melt 4.

As the material of the pipe 2 whose melting point is higher than that of silicon, it is preferred to use carbon, silicon carbide sintered body, silicon carbide crystalline, boron nitride sintered body, silicon oxynitride sintered body, quartz, crystal, silicon nitride sintered body, aluminum oxide sintered body, sapphire, and magnesium oxide sintered body. It may also a complex, mixture, or combination of these materials. In an alternative, a silicon carbide film, silicon nitride film, or silicon oxide film may be coated on the surface of a substrate composed of the above material.

In the case where the material of the pipe 2 is stainless steel or aluminum, the melting point of which is lower than that of silicon, it is preferred that the pipe 2 be subjected to water cooling by means of double tube structure or water cooling jacket, for example.

In place of the above-mentioned gas containing carbon or nitrogen as a carbon or nitrogen source to the silicon melt, powder of silicon carbide or silicon nitride may be added. In this case, such powder may be added directly to the silicon melt. Alternatively, such powder is added in advance to silicon material, and the mixture is melted in the crucible 1. When the above powder is added to the silicon material or the silicon melt, it is necessary to cover the nozzle hole with a mesh-like member composed of silicon carbide or silicon nitride by adjusting the addition amount of each of the above powders so as to be a saturation concentration or below, and by forming each powder so as to increase its size (e.g., not less than 500 µm in particle size). Preferably, the mesh-like hole is 80 µm to 200 µm. This eliminates the event that the powder added to the silicon melt is discharged without being melted and enters into the product. This prevents characteristic deterioration.

As to carbon or nitrogen as the carbon or nitrogen source to the silicon melt, a silicon carbide film or a silicon nitride film may be formed in advance on the surface of silicon material. Thereafter, carbon or nitrogen is added by using the film so formed as a carbon source or nitrogen source, and the silicon material is then melted in the crucible 1. The silicon carbide film can be formed on the surface of the silicon material by means of thermal carbonization. The silicon nitride film can be formed on the surface of silicon material by subjecting it to thermal nitriding. CVD method or sputtering method may be employed to form the silicon carbide film and the silicon nitride film. In the case of adding carbon or nitride by forming a silicon carbide film or a silicon nitride film, it is preferred to adjust the amount of each of the films so as to be not more than the saturation concentration, and cover the nozzle hole with a mesh-like silicon carbide or silicon nitride as in the case of adding the above-mentioned powder. Preferably, the mesh-like hole is 80 µm to 200 µm. This eliminates the event that the formed film is not melted in the silicon melt and discharged in the form of particles and the particles enter into the product. This prevents characteristic deterioration.

Other Preferred Embodiment

Figure 2:
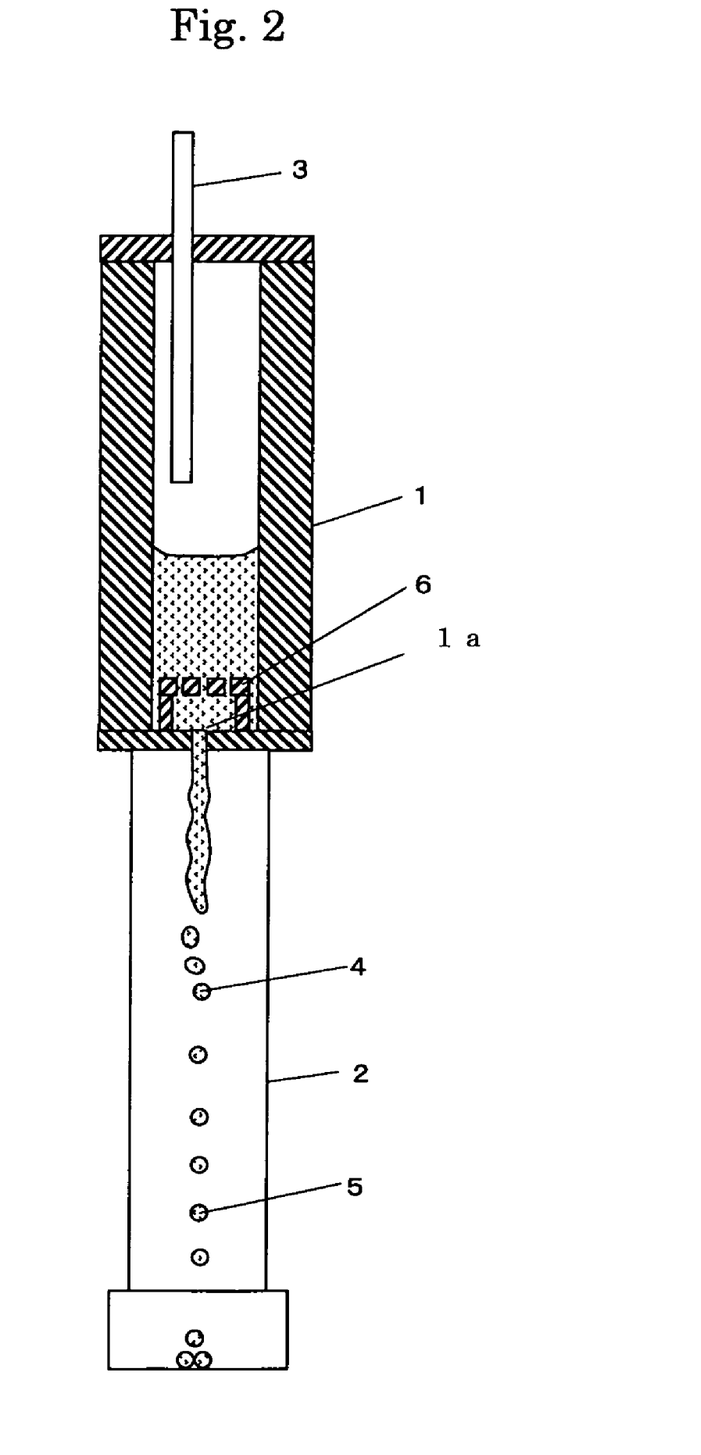
FIG. 2 is a sectional view of a basic construction of a manufacturing apparatus for use in a method for manufacturing a granular silicon crystal according to other preferred embodiment of the present invention.

FIG. 2 is a sectional view of a manufacturing apparatus for use in a method for manufacturing a granular silicon crystal according to other preferred embodiment of the present invention. The same reference characters have been retained for the same components as in FIG. 1, and the description thereof has been left out of the following. The reference numeral 6 designates an inorganic solid member.

According to other preferred embodiment of the present invention, a method for manufacturing a granular silicon crystal 5 includes: allowing silicon melt to be granularly discharged and fallen from a nozzle part 1a composed of silicon carbide or silicon nitride in a crucible 1; and cooling and solidifying the granular silicon melt during falling. A carbon-containing inorganic solid member 6 is introduced when the nozzle part 1a is composed of silicon carbide, and a nitrogen-containing inorganic solid member 6 is introduced when the nozzle part 1a is composed of silicon nitride, into the silicon melt in the crucible 1.

<Inorganic Solid Member: Carbon Source>

When the material of the nozzle part 1a is silicon carbide (a silicon carbide crystalline or silicon carbide sintered body), the carbon-containing inorganic solid member 6 is introduced into the silicon melt in the crucible 1. The member 6 may be in the shape of a mere slice, however, it is required to arrange so as not to block the nozzle hole of the nozzle part 1a. For example, the inorganic solid member 6 can be made in the shape of a ring and arranged so as to surround the nozzle hole of the nozzle part 1a. In an alternative, the inorganic solid member 6 may be in the shape of a disk, or a disk with a recess portion formed above the nozzle hole of the nozzle part 1a. In other alternative, the inorganic solid member 6 may have a spherical shape.

In a still other alternative, as shown in FIG. 2, the inorganic solid member 6 may be in the shape of a cylinder, the upper bottom part of which is left, and the interior is hollowed. The upper bottom part may have a large number of through holes having approximately the same diameter (about 100 µm to 150 µm) as the nozzle hole of the nozzle part 1a. These through holes block passage of large silicon carbide particles or large silicon nitride particles generated in the silicon melt, and function to prevent them from reaching the nozzle part 1a side. Silicon carbide particles or silicon nitride particles generated in the interior of the cylindrical inorganic solid member 6 has less absolute amount, which hardly affects the nozzle part 1a.

If the carbon-containing inorganic solid member 6 is not introduced, there is no chance that carbon elutes from the carbon-containing inorganic solid member 6 to the silicon melt. Consequently, there arises large reaction between the silicon in the silicon melt containing no carbon and the material of the nozzle part 1a (carbon), so that the nozzle part 1a undergoes a change in shape. As a result, for example, the nozzle hole of the nozzle part 1a is enlarged, and the granular silicon melt 4 is enlarged with time, making it difficult to obtain a granular silicon crystal 5 of required particle diameter. For a larger nozzle hole, the granular silicon melt 4, before its solidification, reaches the bottom of the pipe 2, failing to obtain as the granular silicon crystal 5.

In the present invention, preferably, the carbon-containing inorganic solid member 6 as a carbon source to the silicon melt is graphite or silicon carbide of high purity (i.e., approximately 99.99 to 99.999 weight % of purity). The inorganic solid member 6 of spherical shape is preferred in view of a large surface area and much elution. Alternatively, it may be of cube or cylinder with rounded corner parts. In this case, the corner parts causing much elution of carbon are rounded thereby to facilitate control of the amount of elution of carbon.

The carbon-containing inorganic solid member 6 is introduced into the crucible 1 and immersed in the silicon melt. That is, by allowing carbon in a trace amount and to a saturation concentration extent to enter into the silicon melt from the carbon-containing inorganic solid member 6, carbon can be introduced into the silicon melt without allowing carbon to enter as impurities in such an amount as to considerably deteriorate the crystal quality of the granular silicon crystal 5. This can suppress enlargement of the nozzle hole, achieving the granular silicon crystal 5 of high purity and high quality.

When carbon is introduced from the inorganic solid member 6 into the silicon melt, it is preferred to add carbon in an amount of $1\times10^{17}$ atoms/cm$^3$ to $1\times10^{19}$ atoms/cm$^3$ per silicon of 1 cm$^3$. Below $1\times10^{17}$ atoms/cm$^3$, the silicon carbide of the nozzle hole is eluted into the silicon melt thereby to facilitate enlargement of the diameter of the nozzle hole. Above $1\times10^{19}$ atoms/cm$^3$, silicon carbide particles deposit and condense in the silicon melt thereby to facilitate clogging of the nozzle hole. To add carbon in the above-mentioned range into the silicon melt, the amount of carbon in the melt is adjusted by controlling the amount of carbon-containing inorganic solid member to be added.

Preferably, the silicon melt with the inorganic solid member 6 for adding carbon introduced is discharged after silicon is melted and a given time is elapsed to allow a sufficient amount of carbon to be eluted from the inorganic solid member 6. On the contrary, if the silicon melt is discharged immediately after silicon is melted, the eluted carbon may not diffuse sufficiently into the entire silicon melt, causing enlargement of the nozzle hole.

<Inorganic Solid Member: Nitrogen Source>

When the nozzle part 1*a* is composed of silicon nitride (a silicon nitride sintered body), a nitrogen-containing inorganic solid member 6 is introduced into the silicon melt in the crucible 1, so that nitrogen can be introduced into the silicon melt in a trace amount and to a saturation concentration extent. If the nitrogen-containing inorganic solid member 6 is not introduced into the silicon melt, there arises large reaction between the silicon in the silicon melt and the material of the nozzle part 1*a* (nitrogen), so that the nozzle part 1*a* undergoes a change in shape. As a result, the nozzle hole of the nozzle part 1*a* is enlarged, and the granular silicon melt 4 is enlarged with time, making it difficult to obtain a granular silicon crystal 5 of required particle diameter. For a larger nozzle hole, the silicon melt 4, before its solidification, reaches the bottom of the pipe 2, failing to obtain as the granular silicon crystal 5.

Preferably, the nitrogen-containing inorganic solid member 6 as a nitrogen source to the silicon melt is silicon nitride of high purity (i.e., approximately 99.5 to 99.999 weight % of purity). Allowing nitrogen element to elute offers the advantage of suppressing an increase in oxygen concentration of the silicon melt.

By allowing nitrogen to elute from the inorganic solid member 6 and enter into the silicon melt in a trace amount and to a saturation concentration extent, it is possible to suppress enlargement of nozzle hole of the nozzle part 1*a*. As a result, without allowing nitrogen to enter as impurities in such an amount as to considerably deteriorate the crystal quality of the granular silicon crystal 5, nitrogen can be introduced into the silicon melt, achieving the granular silicon crystal 5 of high purity and high quality.

When nitrogen is introduced from the inorganic solid member 6 to the silicon melt, it is preferred to add nitrogen in an amount of $2\times10^{17}$ atoms/cm$^3$ to $2\times10^{19}$ atoms/cm$^3$ per silicon of 1 cm$^3$. Below $2\times10^{17}$ atoms/cm$^3$, the silicon nitride of the nozzle hole is eluted into the silicon melt thereby to facilitate enlargement of the diameter of the nozzle hole. Above $2\times10^{19}$ atoms/cm$^3$, silicon nitride particles deposit and condense at a portion on the silicon melt side in the nozzle part 1*a* thereby to facilitate clogging of the nozzle hole. To add nitrogen in the above-mentioned range to the silicon melt, the amount of nitrogen in the melt is adjusted by controlling the amount of nitrogen-containing inorganic solid member 6 to be added.

In the present invention, enlargement of the nozzle hole, which can be caused by elution of the material of the nozzle part 1*a* due to the silicon melt discharged, can be suppressed by introducing the carbon-containing inorganic solid member 6 when the nozzle part 1*a* is composed of silicon carbide, or the nitrogen-containing inorganic solid member 6 when the nozzle part 1*a* is composed of silicon nitride, into the silicon melt contained in the crucible 1. Thereby, the shape of droplets of silicon melt to be formed when discharged from the nozzle part 1*a* can be stabilized to increase productivity.

Preferably, the carbon-containing inorganic solid member 6 is disposed so as to cover above the nozzle hole of the nozzle part 1*a*, and has a large number of through holes that block passage of silicon carbide particles generated in the silicon melt. Likewise, the nitrogen-containing inorganic solid member 6 is disposed so as to cover above the nozzle hole of the nozzle part 1*a*, and has a large number of through holes that block passage of silicon nitride particles generated in the silicon melt. This can prevent large silicon carbide particles or large silicon nitride particles present in the silicon melt from reaching the nozzle part 1*a* side, so that clogging of the nozzle hole for discharging the silicon melt can be suppressed to permit further stable production.

In the silicon melt that has reached carbon saturation concentration, fine particles of silicon carbide are generated and they grow and float in the silicon melt. The presence of the large number of through holes is also effective in eliminating such silicon carbide particles. This is true for the case of nitrogen.

Specifically, the through holes to be formed in the inorganic solid member 6 may have a diameter of about 80 μm to 200 μm. Below 80 μm, most of silicon carbide particles or silicon nitride particles of less than 80 μm passing the through holes may directly pass the nozzle hole having a diameter of about 150 μm. Above 200 μm, silicon carbide particles or silicon nitride particles larger than the nozzle hole having a diameter of 150 μm may pass the through holes and clog the nozzle hole.

EXAMPLES

The following examples illustrate the manner in which the present invention can be practiced. It is understood, however, that the examples are for the purpose of illustration and the invention is not to be regarded as limited to any of the specific materials or condition therein.

Examples of a method for manufacturing a granular silicon crystal of the present invention will be described below based on the example shown in FIG. 1.

Example I

First, as a material of a granular silicon crystal 5, a 5000 g of silicon containing $1\times10^{16}$ atoms/cm$^3$ of B (boron) as p type dopant was fed in a crucible 1 composed of graphite, and the crucible 1 was heated by electromagnetic induction. A nozzle part 1*a* was a flat one with a nozzle hole (a through hole), which was composed of silicon carbide crystalline. The nozzle hole had a circular lateral cross section and a diameter of 100 μm. The nozzle part 1*a* had a length (a thickness) of 1 mm.

As atmospheric gas, a mixed gas of argon gas and carbon dioxide gas was introduced from a gas introducing pipe 3 into the crucible 1. The mixing ratio of argon gas to carbon dioxide gas was 1000:10 in volume ratio.

Thereafter, the pressure of the atmospheric gas in the crucible 1 was raised from 0.1 MPa, which was the pressure before adding carbon dioxide gas and also the pressure in a pipe 2, to 0.3 MPa. By applying pressure onto the surface of silicon melt, the silicon melt was discharged from the nozzle part 1a to the inside of the pipe 2, and a granular silicon melt 4 was cooled and solidified while allowing it to fall on the inside of the pipe 2, thereby obtaining a granular silicon crystal 5. The obtained granular silicon crystal 5 was 700 μm in mean particle size, 100 μm in standard deviation of particle size, and 95% in recovery. The recovery was calculated by dividing the weight recovered as the granular silicon crystal 5 within a desired particle size (−300 μm to +300 μm) with respect to a mean particle size, by a total feed weight. The obtained granular silicon crystal 5 contained carbon as a trace amount of component of about $1 \times 10^{18}$ atoms/cm$^3$.

The particle size of the granular silicon particles was determined with a laser diffraction scattering type measuring device (manufactured by Nikkisho Co., Ltd.). In a cumulative particle size curve, on which the abscissa represents a particle size D (μm) and the ordinate represents Q % (in a rate of the presence of particles not larger than the particle size D (μm), and the unit is volume % of particles), the value of a particle size $D_{50}$ corresponding to Q %=50% was taken as a mean particle size. The concentration of impurities such as carbon contained in the silicon crystal was determined with an ICP-MS (inductively coupled plasma mass spectrometry) device (manufactured by Micromass CO., Ltd.). This was true for the following examples.

Compartive Example 1

As atmospheric gas, only argon gas was introduced from a gas introducing pipe 3 into a crucible 1. In the same manner as in EXAMPLE 1, by applying pressure onto the surface of silicon melt in the crucible 1, the silicon melt was discharged from the nozzle part 1a to the inside of a pipe 2, and a granular silicon melt 4 was cooled and solidified while allowing it to fall on the inside of the pipe 2, thereby obtaining a granular silicon crystal 5. The obtained granular silicon crystal 5 was 1200 μm in mean particle size, 400 μm in standard deviation of particle size, and 10% in recovery. The recovery was calculated by dividing the weight recovered as the granular silicon crystal 5 within a desired particle size (−300 μm to +300 μm) with respect to a mean particle size by a total feed weight. The obtained granular silicon crystal 5 contained carbon as a trace amount of component of about $3 \times 10^{16}$ atoms/cm$^3$.

Example 2

A nozzle part 1a was a flat one with a nozzle hole (a through hole), which was composed of silicon nitride sintered body. The nozzle hole had a diameter of 100 μm. The nozzle part 1a had a length (a thickness) of 1 mm.

As atmospheric gas, a mixed gas of argon gas and nitrogen gas was introduced from a gas introducing pipe 3 into a crucible 1. The mixing ratio of argon gas to nitrogen was 1000:50 in volume ratio.

Thereafter, the pressure of the atmospheric gas in the crucible 1 was raised from 0.1 MPa, which was the pressure before adding nitrogen gas and also the pressure in the pipe 2, to 0.3 MPa. By applying pressure onto the surface of silicon melt, the silicon melt was discharged from the nozzle part 1a to the inside of the pipe 2, and a granular silicon melt 4 was cooled and solidified while allowing it to fall on the inside of the pipe 2, thereby obtaining a granular silicon crystal 5. The obtained granular silicon crystal 5 was 700 μm in mean particle size, 90 μm in standard deviation of particle size, and 97% in recovery. The recovery was calculated by dividing the weight recovered as the granular silicon crystal 5 within a desired particle size (−300 μm to +300 μm) with respect to a mean particle size, by a total feed weight. The obtained granular silicon crystal 5 contained nitrogen as a trace amount of component of about $5 \times 10^{17}$ atoms/cm$^3$.

Compartive Example 2

As atmospheric gas, only argon gas was introduced from a gas introducing pipe 3 into a crucible 1. In the same manner as in EXAMPLE 2, by applying pressure onto the surface of silicon melt in the crucible 1, the silicon melt was discharged from the nozzle part 1a to the inside of a pipe 2, and a granular silicon melt 4 was cooled and solidified while allowing it to fall on the inside of the pipe 2, thereby obtaining a granular silicon crystal 5. The obtained granular silicon crystal 5 was 1400 μm in mean particle size, 450 μm in standard deviation of particle size, and 15% in recovery. The recovery was calculated by dividing the weight recovered as the granular silicon crystal 5 within a desired particle size (−400 μm to +400 μm) with respect to a mean particle size, by a total feed weight. The obtained granular silicon crystal 5 contained nitrogen as a trace amount of component of about $1 \times 10^{16}$ atoms/cm$^3$.

Example 3

A nozzle part 1a was a flat one with a nozzle hole (a through hole), which was composed of silicon carbide crystalline. The nozzle hole had a circular lateral cross section and a diameter of 100 μm. The nozzle part 1a had a length (a thickness) of 1 mm. An inorganic solid member 6 composed of silicon carbide was placed in a crucible 1. As shown in FIG. 2, the inorganic solid member 6 was in the shape of a cylinder having a diameter of about 10 mm and a height of about 3 mm, the upper bottom part of which was left, and the interior was hollowed. The upper bottom part having a thickness of about 1 mm had a large number of through holes having approximately the same diameter as the nozzle hole of the nozzle part 1a. The corner parts of the inorganic solid member 6 were rounded to suppress excess elution of carbon from the corner parts.

As a material of a granular silicon crystal 5, a 5000 g of silicon containing $1 \times 10^{16}$ atoms/cm$^3$ of B (boron) as p type dopant was fed in a crucible 1 composed of graphite, and the crucible 1 was heated by electromagnetic induction.

As atmospheric gas, argon gas was used and circulated in the crucible 1, thereby eliminating exhaust gas such as silicon monoxide to be formed from the silicon melt in the crucible 1.

Thereafter, the pressure of the atmospheric gas in the crucible 1 was raised from 0.1 MPa, which was the pressure in a pipe 2, to 0.3 MPa. By applying pressure onto the surface of silicon melt, the silicon melt was discharged from the nozzle part 1a to the inside of the pipe 2, and a granular silicon melt 4 was cooled and solidified while allowing it to fall on the inside of the pipe 2, thereby obtaining a granular silicon crystal 5. The obtained granular silicon crystal 5 was 450 μm in mean particle size, 70 μm in standard deviation of particle size, and 96% in recovery. The recovery was calculated by dividing the weight recovered as the granular silicon crystal 5 within a desired particle size (−300 μm to +300 μm) with respect to a mean particle size, by a total feed weight. The obtained granular silicon crystal 5 contained carbon as a trace amount of component of about $1 \times 10^{18}$ atoms/cm$^3$.

After the discharge of the silicon melt was repeated a large number of times, the nozzle hole was observed. The hole diameter was not enlarged, and nearly 100 μm was retained. Moreover, particles such as slug formed in the silicon melt did not pass the through holes of the inorganic solid member 6, that is, they were filtered. No clogging of the nozzle hole was observed.

Compartive Example 3

No inorganic solid member 6 was introduced in silicon melt in a crucible 1. In the same manner as in EXAMPLE 1, by applying pressure onto the surface of the silicon melt in the crucible 1, the silicon melt was discharged from a nozzle part 1a to the inside of a pipe 2, and granular silicon melt 4 was cooled and solidified while allowing it to fall on the inside of the pipe 2, thereby obtaining a granular silicon crystal 5. The obtained granular silicon crystal 5 was 800 μm in mean particle size, 200 μm in standard deviation of particle size, and 10% in recovery. The recovery was calculated by dividing the weight recovered as the granular silicon crystal 5 within a desired particle size (−300 μm to +300 μm) with respect to a mean particle size, by a total feed weight. The obtained granular silicon crystal 5 contained carbon as a trace amount of component of about $2 \times 10^{16}$ atoms/cm$^3$.

Example 4

A nozzle part 1a was a flat one with a nozzle hole (a through hole), which was composed of silicon nitride sintered body. The nozzle hole had a diameter of 100 μm. The nozzle part 1a had a length (a thickness) of 1 mm. Surroundings of the nozzle hole was projected from the upper surface of the nozzle part 1a, and ten spherical inorganic solid members 6, which were composed of silicon nitride and about 5 mm in diameter, were placed in the crucible 1.

As atmospheric gas, argon gas was introduced from a gas introducing pipe 3 into the crucible 1.

As a material of a granular silicon crystal 5, a 5000 g of silicon containing $1 \times 10^{16}$ atoms/cm$^3$ of B (boron) as p type dopant was fed in the crucible 1 composed of graphite, and the crucible 1 was heated by means of electromagnetic induction.

Thereafter, the pressure of the atmospheric gas in the crucible 1 was raised from 0.1 MPa, which was the pressure in a pipe 2, to 0.3 MPa. By applying pressure onto the surface of silicon melt, the silicon melt was discharged from the nozzle part 1a to the inside of the pipe 2, and a granular silicon melt 4 was cooled and solidified while allowing it to fall on the inside of the pipe 2, thereby obtaining a granular silicon crystal 5. The obtained granular silicon crystal 5 was 480 μm in mean particle size, 70 μm in standard deviation of particle size, and 97% in recovery. The recovery was calculated by dividing the weight recovered as the granular silicon crystal 5 within a desired particle size (−300 μm to +300 μm) with respect to a mean particle size, by a total feed weight. The obtained granular silicon crystal 5 contained nitrogen as a trace amount of component of about $7 \times 10^{17}$ atoms/cm$^3$.

After the discharge of the silicon melt was repeated a large number of times, the nozzle hole was observed. There was no enlargement of the hole diameter.

Compartive Example 4

As atmospheric gas, only argon gas was introduced from a gas introducing pipe 3 into a crucible 1. In the same manner as in EXAMPLE 4, except that no inorganic solid member 6 composed of silicon nitride was placed in the crucible 1, by applying pressure onto the surface of silicon melt, the silicon melt was discharged from a nozzle part 1a to the inside of a pipe 2, and a granular silicon melt 4 was cooled and solidified while allowing it to fall on the inside of the pipe 2, thereby obtaining a granular silicon crystal 5. The obtained granular silicon crystal 5 was 900 μm in mean particle size, 220 μm in standard deviation of particle size, and 15% in recovery. The recovery was calculated by dividing the weight recovered as the granular silicon crystal 5 within a desired particle size (−400 μm to +400 μm) with respect to a mean particle size, by a total feed weight. The obtained granular silicon crystal 5 contained nitrogen as a trace amount of component of about $1 \times 10^{16}$ atoms/cm$^3$.

Based on the foregoing results, the granular silicon crystals obtained in the examples of the present invention had narrow variations in particle size and a larger recovery than the granular silicon crystals obtained in the comparative examples. This shows that the method for manufacturing a granular silicon crystal of the present invention enables granular silicon crystals having narrow variations of particle size to be produced at high productivity and superior reproducibility.

It is to be understood that the present invention is not limited to the foregoing preferred embodiments and examples but is susceptible of various changes and modifications without departing from the spirit and scope of the claimed invention.

What is claimed is:

1. A method for manufacturing a granular silicon crystal comprising:
    allowing silicon melt in a crucible to be granularly discharged and fallen from a nozzle part composed of silicon carbide or silicon nitride; and
    cooling and solidifying the granular silicon melt during falling,
    to the silicon melt in the crucible, a carbon source being added when the nozzle part is composed of silicon carbonate, and a nitrogen source being added when the nozzle part is composed of silicon nitride.

2. The method for manufacturing a granular silicon crystal according to claim 1, wherein
    the carbon source is carbon-containing gas and the nitrogen source is nitrogen-containing gas, and
    to atmospheric gas in the crucible containing silicon melt, carbon-containing gas is added when the nozzle part is composed of silicon carbide, and nitrogen-containing gas is added when the nozzle part is composed of silicon nitride.

3. The method for manufacturing a granular silicon crystal according to claim 2, wherein the carbon-containing gas is carbon monoxide gas or carbon dioxide gas when the nozzle part is composed of silicon carbide.

4. The method for manufacturing a granular silicon crystal according to claim 2, wherein, when the nozzle part is composed of silicon carbide, carbon is added in an amount of $1 \times 10^{17}$ atoms/cm$^3$ to $1 \times 10^{19}$ atoms/cm$^3$ per silicon of 1 cm$^3$ to the silicon melt.

5. The method for manufacturing a granular silicon crystal according to claim 2, wherein the nitrogen-containing gas is nitrogen gas when the nozzle part is composed of silicon nitride.

6. The method for manufacturing a granular silicon crystal according to claim 2, wherein, when the nozzle part is composed of silicon nitride, nitrogen is added in an amount of $2\times10^{17}$ atoms/cm$^3$ to $2\times10^{19}$ atoms/cm$^3$ per silicon of 1 cm$^3$ to the silicon melt.

7. The method for manufacturing a granular silicon crystal according to claim 2, wherein, to the atmospheric gas in the crucible containing silicon melt, the carbon-containing gas is added when the nozzle part is composed of silicon carbide, and the nitrogen-containing gas is added when the nozzle part is composed of silicon nitride, and thereafter the pressure of the atmospheric gas in the crucible is raised than the pressure before the gas is added.

8. The method for manufacturing a granular silicon crystal according to claim 2, wherein a gas introducing pipe for adding gas containing carbon or nitrogen into silicon melt has a gas discharge port positioned 10 mm to 300 mm above from the surface of the silicon melt.

9. The method for manufacturing a granular silicon crystal according to claim 1, wherein the carbon source is silicon carbide powder, and the nitrogen source is silicon nitride powder.

10. The method for manufacturing a granular silicon crystal according to claim 1, wherein silicon of the silicon melt is silicon obtained by forming a silicon carbide film as the carbon source on the surface of silicon material by carbonization process when the nozzle part is composed of silicon carbide, and is silicon obtained by forming a silicon nitride film as the nitrogen source on the surface of silicon material by nitriding process when the nozzle part is composed of silicon nitride.

11. The method for manufacturing a granular silicon crystal according to claim 1, wherein
the carbon source is carbon-containing inorganic solid member, and the nitrogen source is nitrogen-containing solid member,
the carbon-containing inorganic solid member is introduced when the nozzle part is composed of silicon carbide, and the nitrogen-containing inorganic solid member is introduced when the nozzle part is composed of silicon nitride, into the silicon melt in the crucible.

12. The method for manufacturing a granular silicon crystal according to claim 11, wherein, when the nozzle part is composed of silicon carbide, carbon is added in an amount of $1\times10^{17}$ atoms/cm$^3$ to $1\times10^{19}$ atoms/cm$^3$ per silicon of 1 cm$^3$ to the silicon melt.

13. The method for manufacturing a granular silicon crystal according to claim 11, wherein the nitrogen-containing inorganic solid member is composed of silicon nitride.

14. The method for manufacturing a granular silicon crystal according to claim 11, wherein, when the nozzle part is composed of silicon nitride, nitrogen is added in an amount of $2\times10^{17}$ atoms/cm$^3$ to $2\times10^{19}$ atoms/cm$^3$ per silicon of 1 cm$^3$ to the silicon melt.

15. The method for manufacturing a granular silicon crystal according to claim 11, wherein the carbon-containing inorganic solid member is disposed so as to cover above the nozzle hole of the nozzle part, and is provided with a large number of through holes blocking passage of silicon carbide particles generated in the silicon melt.

16. The method for manufacturing a granular silicon crystal according to claim 15, wherein the through holes have a diameter of 80 μm to 200 μm.

17. The method for manufacturing a granular silicon crystal according to claim 11, wherein the nitrogen-containing inorganic solid member is disposed so as to cover above the nozzle hole of the nozzle part, and is provided with a large number of through holes blocking passage of silicon nitride particles generated in the silicon melt.

18. The method for manufacturing a granular silicon crystal according to claim 17, wherein the through holes have a diameter of 80 μm to 200 μm.

19. The method for manufacturing a granular silicon crystal according to claim 1, wherein the carbon-containing inorganic solid member is composed of graphite or silicon carbide.

* * * * *